(12) United States Patent
Classen et al.

(10) Patent No.: US 9,212,048 B2
(45) Date of Patent: Dec. 15, 2015

(54) HYBRIDLY INTEGRATED COMPONENT AND METHOD FOR THE PRODUCTION THEREOF

(71) Applicants: Johannes Classen, Reutlingen (DE); Heribert Weber, Nuertingen (DE); Mirko Hattass, Stuttgart (DE); Daniel Christoph Meisel, Reutlingen (DE)

(72) Inventors: Johannes Classen, Reutlingen (DE); Heribert Weber, Nuertingen (DE); Mirko Hattass, Stuttgart (DE); Daniel Christoph Meisel, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 55 days.

(21) Appl. No.: 13/890,363

(22) Filed: May 9, 2013

(65) Prior Publication Data
US 2013/0299928 A1 Nov. 14, 2013

(30) Foreign Application Priority Data
May 14, 2012 (DE) .......................... 10 2012 208 031

(51) Int. Cl.
*B81B 3/00* (2006.01)
*B81C 1/00* (2006.01)
(52) U.S. Cl.
CPC ........... *B81B 3/0075* (2013.01); *B81C 1/00238* (2013.01); *B81C 1/00674* (2013.01); *B81B 2207/07* (2013.01); *B81B 2207/096* (2013.01); *B81C 2203/0109* (2013.01); *H01L 2224/16225* (2013.01); *H01L 2924/19105* (2013.01)

(58) Field of Classification Search
None
See application file for complete search history.

(56) References Cited

U.S. PATENT DOCUMENTS

2010/0307247 A1* 12/2010 Weber .......................... 73/514.29
2011/0049652 A1    3/2011 Wu et al.
2012/0032283 A1*  2/2012 Frey et al. ..................... 257/415

* cited by examiner

*Primary Examiner* — Steven Loke
*Assistant Examiner* — Juanita B Rhodes
(74) *Attorney, Agent, or Firm* — Kenyon & Kenyon LLP

(57) ABSTRACT

A hybridly integrated component includes an ASIC element having a processed front side, a first MEMS element having a micromechanical structure extending over the entire thickness of the first MEMS substrate, and a first cap wafer mounted over the micromechanical structure of the first MEMS element. At least one structural element of the micromechanical structure of the first MEMS element is deflectable, and the first MEMS element is mounted on the processed front side of the ASIC element such that a gap exists between the micromechanical structure and the ASIC element. A second MEMS element is mounted on the rear side of the ASIC element. The micromechanical structure of the second MEMS element extends over the entire thickness of the second MEMS substrate and includes at least one deflectable structural element.

12 Claims, 15 Drawing Sheets

HYBRIDLY INTEGRATED COMPONENT AND METHOD FOR THE PRODUCTION THEREOF

BACKGROUND OF THE INVENTION

1. Field of the Invention

The present invention relates to a hybridly integrated component that includes at least one ASIC (application-specific integrated circuit) element having a processed front side, a first MEMS (micro-electromechanical systems) element having a micromechanical structure, and a first cap wafer. The micromechanical structure of the first MEMS element extends over the entire thickness of the MEMS substrate and includes at least one deflectable structural element. The first MEMS element is mounted on the processed front side of the ASIC element in such a way that a gap exists between the micromechanical structure and the ASIC element. The first cap wafer is mounted over the micromechanical structure of the first MEMS element. In addition, the present invention relates to a method for producing such a hybridly integrated component.

2. Description of the Related Art

Components having MEMS components have been mass-produced for many years for a wide variety of applications, for example in the area of automotive technology and consumer electronics. The miniaturization of the components has become increasingly important. The miniaturization contributes substantially to reducing the production costs of the components and thus also of the end devices. In addition, in particular in the area of consumer electronics more and more functions—and therefore components—are to be incorporated into an end device, while the end devices themselves become ever smaller. Consequently, less and less space is available on the application circuit boards for the individual components.

In practical use, various miniaturization designs for sensor components are known that provide an integration of the micromechanically realized sensor function and the circuit-based processing and evaluation of the sensor signals in a component. Besides the lateral integration of the MEMS function and the ASIC function on a common chip, there are also designs for so-called vertical hybrid integration, according to which a chip stack is formed of an ASIC, a MEMS, and a cap wafer.

Such a vertically integrated component and a method for its production are described in US Patent Application Publication No. 2011/0049652 A1. The known method provides the bonding of the initial substrate for the MEMS element on an already-processed ASIC substrate. Only after this is a micromechanical structure produced in the MEMS substrate, including at least one deflectable structural element. Independently of this, a cap wafer is structured and is prepared for mounting over the micromechanical structure of the MEMS substrate and on the ASIC substrate. The cap wafer processed in this way is bonded onto the ASIC substrate after the structuring of the MEMS substrate, so that the micromechanical structure between the ASIC substrate and the cap wafer is enclosed so as to be hermetically sealed.

The known component design enables an economical mass production of robust components having a micromechanical function and a signal processing circuit, because here not only are the individual components—MEMS element, cap, and ASIC—produced in the wafer composite, but their assembly to form a component on the wafer level is also realized. The MEMS functions and the ASIC functions can be tested on the wafer level, and even the calibration of the individual components can be carried out before their separation on the wafer level. Moreover, due to the stacked construction the known components require a comparatively small mounting surface, which has an advantageous effect on the production costs of the end devices.

The known component design presupposes a good surface matching between the MEMS element and the ASIC element. Accordingly, the miniaturization effect and the cost advantage connected therewith is particularly large if the micromechanical MEMS function and the circuit-based ASIC function have a comparable surface requirement. Only in this case can both elements be realized without wasting chip surface.

However, in a series of applications known from practical use, the micromechanical structure of the MEMS element takes up significantly larger chip surface than is required for the realization of the associated ASIC function. Examples of this include rotational rate sensors and so-called IMUs (Inertial Measurement Units), where rotational rate sensor elements and acceleration sensor elements are integrated with relatively large micromechanical structures in one component.

BRIEF SUMMARY OF THE INVENTION

The present invention provides measures for realizing hybridly integrated components of the type named above, through which a particularly high integration density and a particularly effective surface usage can be achieved, in particular when the surface requirement for the realization of the MEMS function is significantly greater than that for the realization of the ASIC function.

According to the present invention, this is achieved with the aid of a second MEMS element on the rear side of the ASIC element, whose micromechanical structure extends over the entire thickness of the second MEMS substrate and includes at least one deflectable structural element. This second MEMS element is mounted on the rear side of the ASIC element in such a way that a gap exists between the micromechanical structure of the second MEMS element and the ASIC element. A second cap wafer is then mounted over the micromechanical structure of the second MEMS element.

According to the present invention, a five-fold wafer stack is accordingly produced that includes two MEMS elements and one ASIC element. Through this feature alone, the component produced by the present invention is equipped with a very high functionality per mounting surface. Advantageously, the MEMS elements and the ASIC element form a functional unit, for example in the form of two micromechanical sensor elements that supplement one another in their sensor function, whose signal processing and evaluation circuit is integrated on the ASIC element. The micromechanical structures of the two MEMS elements of a component can be identical or similar if these elements are intended to fulfill comparable functions. In the context of a component according to the present invention, however, MEMS elements may be combined that have completely different sensor or actuator functions, and accordingly also have completely different micromechanical structures.

The design according to the present invention is suitable in particular for the realization of contactlessly operating sensors, such as acceleration sensors, rotational rate sensors, and other inertial sensors. In the case of an inertial sensor, the micromechanical sensor structure includes at least one elastically suspended seismic mass that is deflected on the basis of accelerations. These accelerations can also be caused by centrifugal forces or rotational movements. The deflections of the seismic mass are acquired and evaluated.

Because according to the present invention the micromechanical structures of both MEMS elements each extend over the entire thickness of the corresponding MEMS substrate, here relatively large seismic masses can be realized on a comparatively small chip surface, which has a positive effect on the measurement sensitivity of such sensor elements.

The component design according to the present invention moreover provides a cap of the micromechanical structures of both MEMS elements in that both MEMS elements are situated in sandwiched fashion between the respective cap wafer and the ASIC element situated centrically in the wafer stack. In this way, the sensor structures are protected against contamination, moisture, and particles. In addition, environmental influences on the measurement signals are minimized. In this way, moreover, defined pressure conditions can be created for the sensor structures that substantially contribute to determining the damping behavior of the sensor elements.

As already mentioned, preferably circuit functions are integrated on the ASIC element that support and supplement the micromechanical functions of the MEMS elements. In the case of micromechanical sensor elements, these can be parts of an evaluation circuit, while the ASIC element of an actuator component will preferably include circuit means for controlling the micromechanical structure. In this context, it turns out to be advantageous if through-contacts, so-called TSVs (Through Silicon Vias), are fashioned in the ASIC element that extends from the rear side up to the processed front side, where the circuit functions of the ASIC element are integrated. With the aid of such ASIC through-contacts, a particularly protected and stable electrical connection is easily produced between the rear-side MEMS element and the ASIC element.

The production method according to the present invention can be varied in many ways, in particular relating to the mechanical and electrical connection between the individual components of the five-fold wafer stack and the external electrical contacting of the resulting component. Here, the function, intended use, and location of installation of the component to be produced must be taken into account.

In any case, the production method according to the present invention provides a pre-processing of the ASIC substrate in which the circuit functions are realized and ASIC through-contacts are also already made. In a further method step, the ASIC substrate can be thinned on the rear side in order to reduce the overall component height. This method step can be carried out either in the context of the pre-processing, i.e. before the mounting of the first MEMS substrate on the processed front side of the ASIC substrate, or not until after the mounting of the first MEMS substrate, at the latest before the mounting of the second MEMS substrate on the then thinned rear side of the ASIC substrate.

Moreover, in the context of the processing of the ASIC substrate, a structuring of the mounting surfaces for the two MEMS substrates can be carried out. For example, recesses can be produced in the ASIC surface in order to ensure the movability of structural elements of the adjoining MEMS substrate. In a particularly advantageous specific embodiment of the present invention, on the processed front side of the ASIC substrate a base structure is produced for the mounting of the first MEMS substrate, so that a gap exists between the ASIC substrate and the mounted first MEMS substrate. Such a standoff structure can also be produced on the rear side of the ASIC substrate for the mounting of the second MEMS substrate.

The connection between the first or second MEMS substrate and the ASIC substrate is preferably produced in a bonding process, because in this way it is possible to realize both a hermetically sealed mechanical connection and also reliable electrical connections between the MEMS element and the ASIC element. A number of known process variants that have been proven in practice are available for this, such as plasma-activated direct bonding or eutectic bonding.

The micromechanical structures of the two MEMS elements are each defined and exposed in a structuring process that extends over the entire thickness of the corresponding MEMS substrate. Advantageously, the two MEMS substrates are therefore first thinned before the structuring, down to a structural height suitable for the realization of the respective MEMS function.

The structuring of the MEMS substrates preferably takes place in a trench process, because this method enables the production of trench structures having a particularly high aspect ratio.

With regard to a component design that is as compact as possible and a reliable internal electrical contacting between the individual components of the overall component, it turns out to be advantageous if MEMS through-contacts are also produced in the first and/or in the second MEMS substrate as an electrical connection to the ASIC substrate.

Differing from the MEMS substrates, which are not structured until after mounting on the ASIC substrate, the cap wafers of the component according to the present invention are pre-structured. If warranted, in this pre-processing, cap through-contacts are also produced for the external electrical contacting of the overall component. As in the mounting of the MEMS substrates on the ASIC substrate, the mounting of the pre-processed cap wafers also preferably takes place using a bonding process, because in this way it is easy to produce reliable and long-lasting mechanical and electrical connections.

The external electrical contacting of a component according to the present invention can be carried out using wire bonds, if corresponding exposed connection pads are fashioned on the ASIC element. In this case, as a rule the component is also provided with an outer packaging, for example in the form of a molded housing.

In a particularly advantageous variant of the present invention, the external electrical contacting of the component takes place via cap through-contacts in one of the two cap wafers. In this case, the component can be mounted directly over the corresponding cap wafer on a circuit board, and in addition to the mechanical fixing of the component an electrical connection to the printed conductors on the circuit board is also produced. An outer packaging of the five-fold wafer stack is not required here. Because the mounting takes place via a cap wafer, both the two MEMS elements and also the ASIC element of the component are mechanically decoupled relatively well from the circuit board, so that a bending of the circuit board will not have a significant effect on the functionality of the component.

DETAILED DESCRIPTION OF THE INVENTION

The method according to the present invention for producing a hybridly integrated component in the form of a five-fold wafer stack having two MEMS elements and one ASIC element begins with a pre-processed ASIC substrate. Advantageously, the ASIC substrate is equipped, during the pre-processing, with a signal processing circuit and with an evaluation or control circuit for the two MEMS elements. In addition, however, MEMS-independent circuit functions can also be realized.

Figure 1:
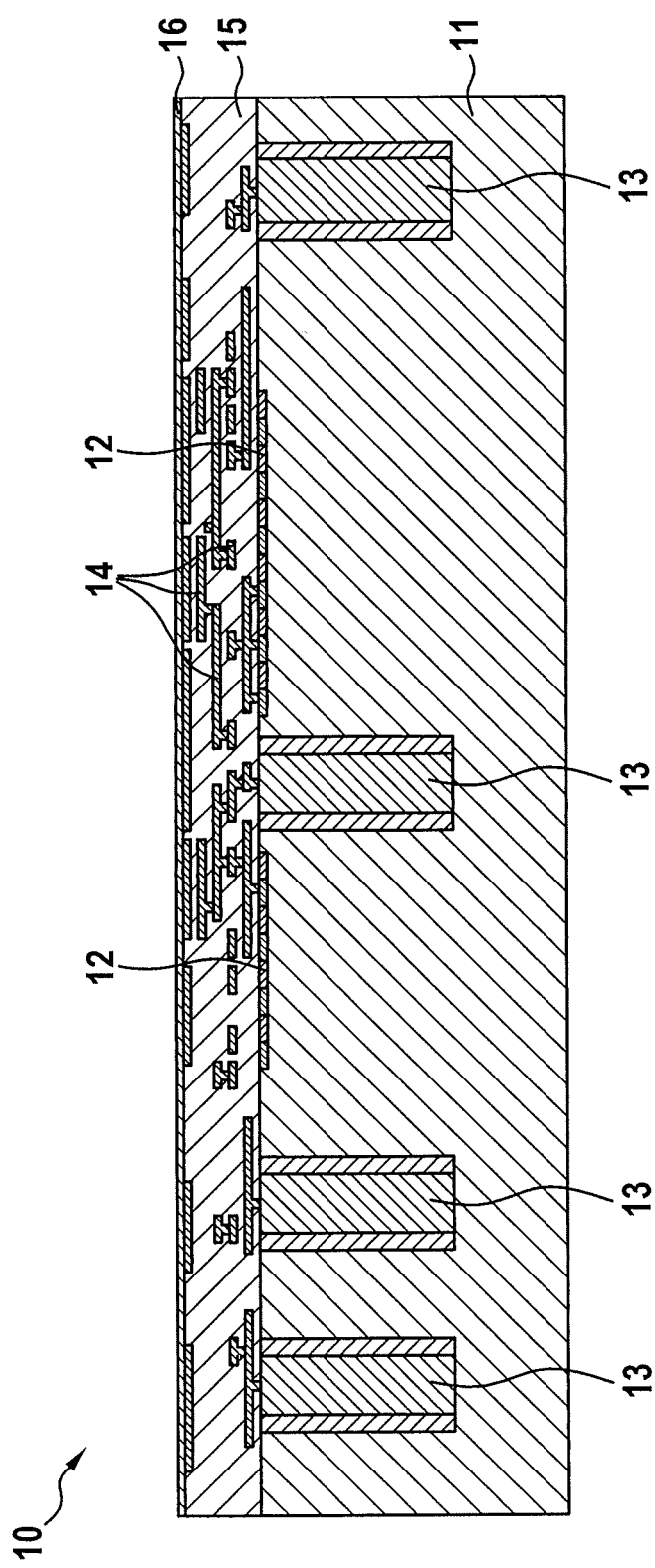
FIGS. 1-13 illustrate, on the basis of schematic sectional representations, the production of the five-fold wafer stack of a first sensor component 100 corresponding to the component design according to the present invention.

FIG. 1 shows an ASIC substrate 10 after such a pre-processing. First, ASIC circuit functions 12 were integrated into initial substrate 11. Subsequently, ASIC through-contacts 13 were created in initial substrate 11 in the form of metallized blind holes, and finally a layer construction having a plurality of circuit layers 14 was produced on initial substrate 11. Circuit layers 14 are realized in the form of structured metallic layers 14 that are embedded in an insulating layer 15. The front side, processed in this way, of ASIC substrate 10 was finally also provided with a nitride passivation 16.

Here it is to be noted that metallized blind holes 13 for the ASIC through-contacts can also be produced before the semiconductor functionality 12, or may be produced in ASIC substrate 11, provided with the layer construction, only subsequently. In other respects, the pre-processing of ASIC substrate 10 is not described here in detail, because, except for the making of the ASIC through-contacts, it is not specified in more detail by the present invention.

Figure 2:
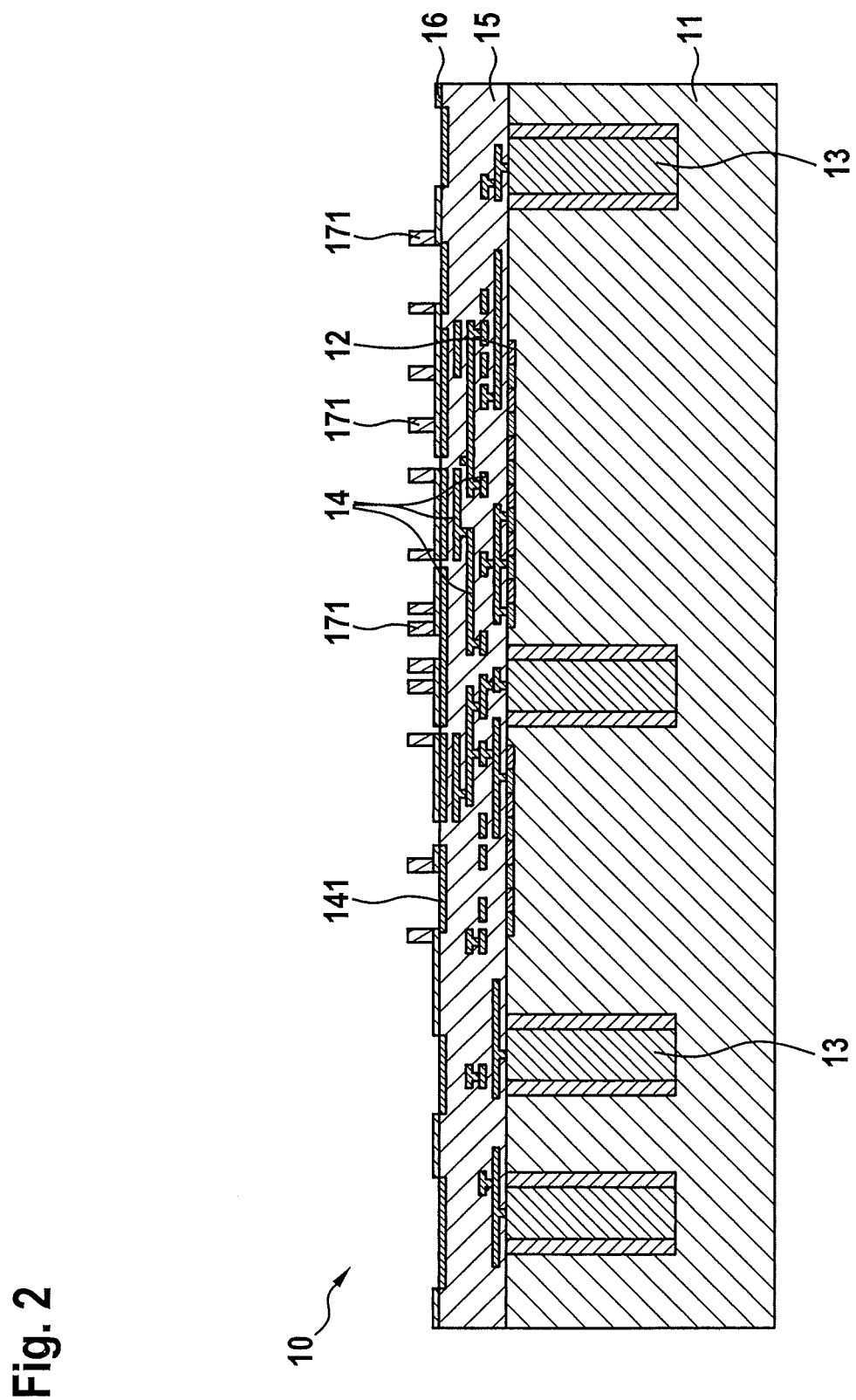

In a subsequent method step, nitride passivation 16 is structured in order to enable an electrical contacting of uppermost circuit level 141 of ASIC substrate 10. An oxide layer 171 is then deposited on the surface of ASIC substrate 10 and is structured in order to create a standoff structure 171 for the mounting of a first MEMS substrate. FIG. 2 shows the result of this structuring process, and illustrates that in the structuring of oxide layer 171 accesses were also created for the electrical contacting of first circuit layer 141 of ASIC substrate 10.

Figure 3:
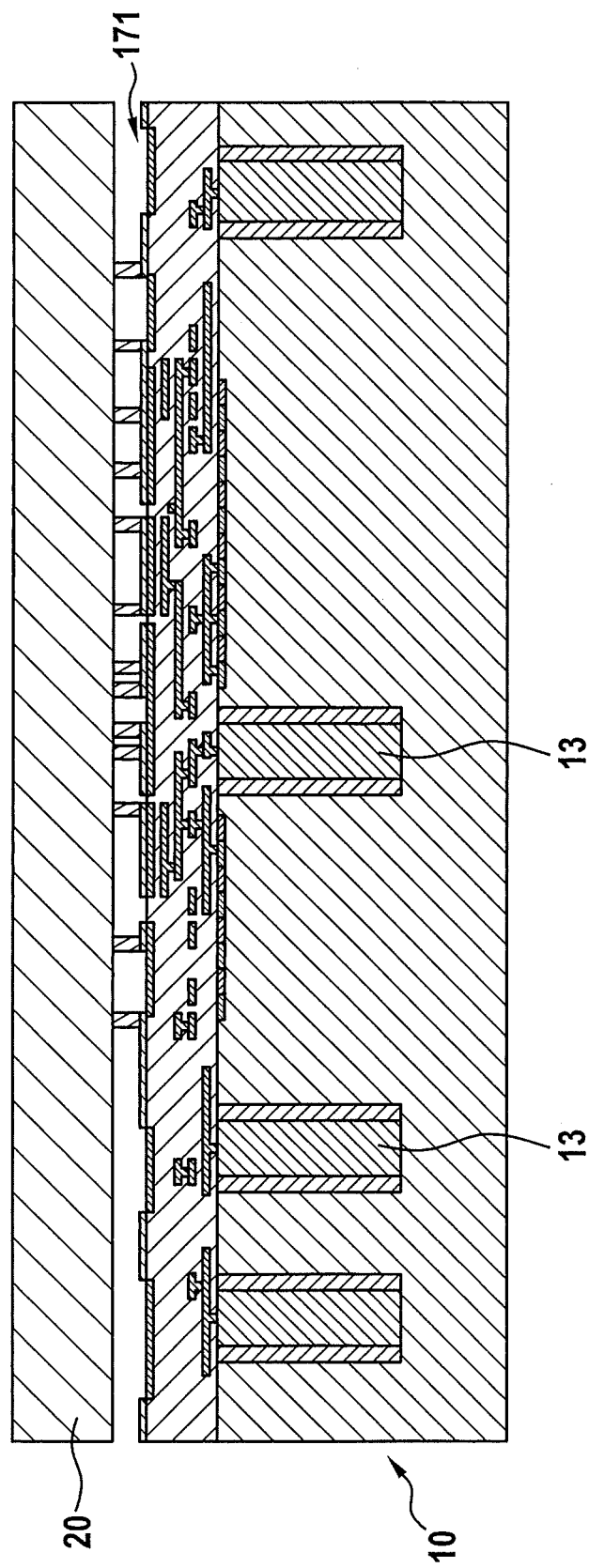

Structured oxide layer 171 forms the mounting surface for an unstructured first MEMS substrate 20. The connection between first MEMS substrate 20 and ASIC substrate 10 is produced here in a plasma-activated direct bonding method, and is hermetically sealed. Relatively thick MEMS substrate 20 is now thinned, for example using a grinding process, until its thickness corresponds approximately to the sought structural height of the first MEMS element. This is typically in a range between 10 μm and 150 μm. FIG. 3 shows ASIC substrate 10 with the thinned but not yet structured first MEMS substrate 20, and illustrates the functioning of standoff structure 171 as a spacing element between the closed surface of ASIC substrate 10 and first MEMS substrate 20.

First MEMS substrate 20 is structured only in combination with ASIC substrate 10. In the present exemplary embodiment, this structuring takes place in two steps.

Figure 4:
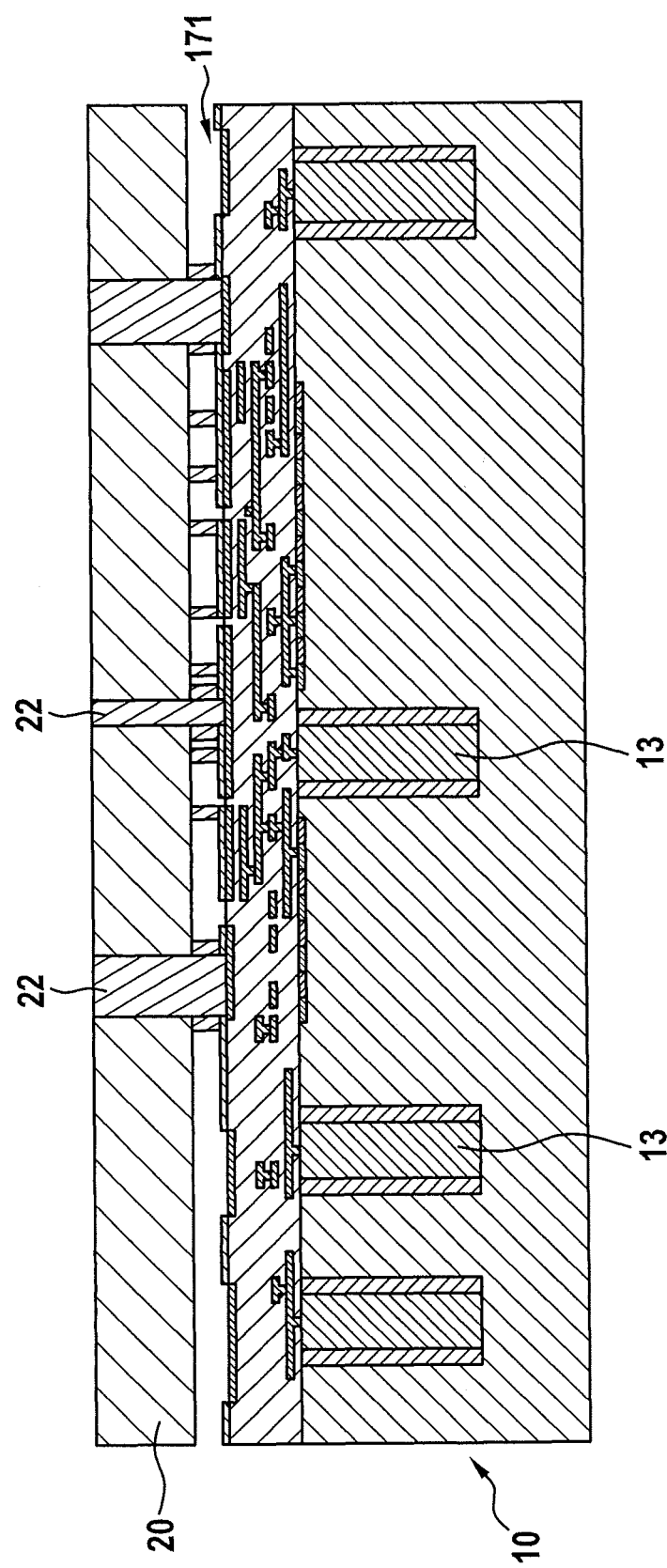

The first structuring step is used to produce through-contacts, so-called vias 22. Here, through-openings having substantially circular cross-section are produced in MEMS substrate 20, and open into openings in standoff structure 171 at the locations where passivation layer 16 was opened for the electrical contacting of ASIC substrate 10. The through-openings typically have an aspect ratio of from 5:1 to 20:1, and extend over the entire thickness of MEMS substrate 20. Standardly, the walls of these through-openings are coated with a conductive diffusion barrier such as titanium nitride or titanium-tungsten before being filled with an electrically conductive material 22, such as copper or tungsten, in a deposition process. FIG. 4 shows ASIC substrate 10 with first MEMS substrate 20 after the filling of the through-openings, and after the conductive material that was at that time deposited on the surface of MEMS substrate 20 has again been removed.

Figure 5:
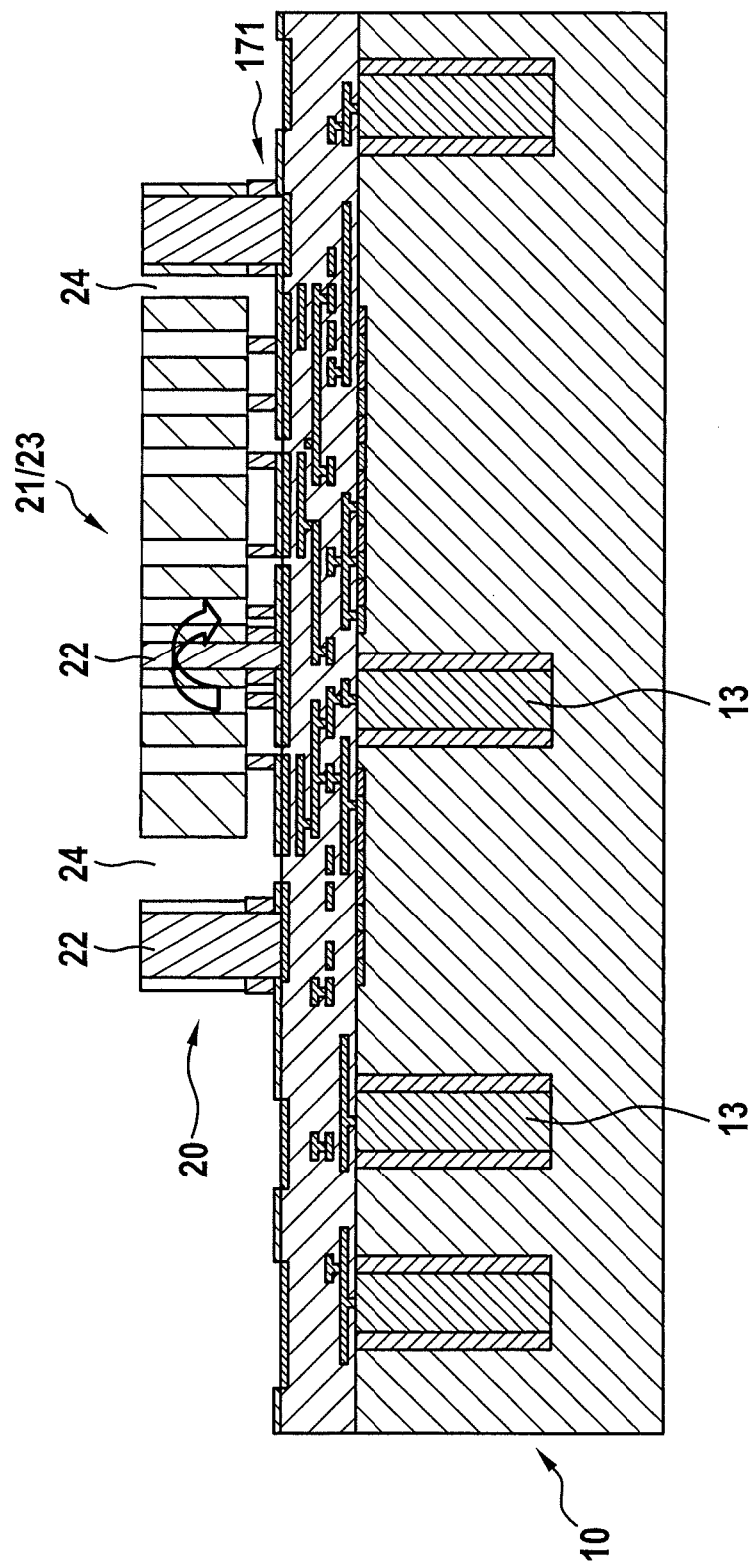

In the second structuring step, micromechanical structure 21 of first MEMS element 20 is produced. It extends over the entire thickness of MEMS substrate 20, as is shown in FIG. 5. A trench process is preferably used both for the first and for the second structuring step, because with this method structures can be produced having a particularly high aspect ratio.

In the present case, the first MEMS element is a z acceleration sensor having a rocker design. Micromechanical sensor structure 21 includes a rocker structure 23, centrically spring-mounted, as a seismic mass that is defined and exposed by trenches 24 in first MEMS substrate 20.

Figure 6:
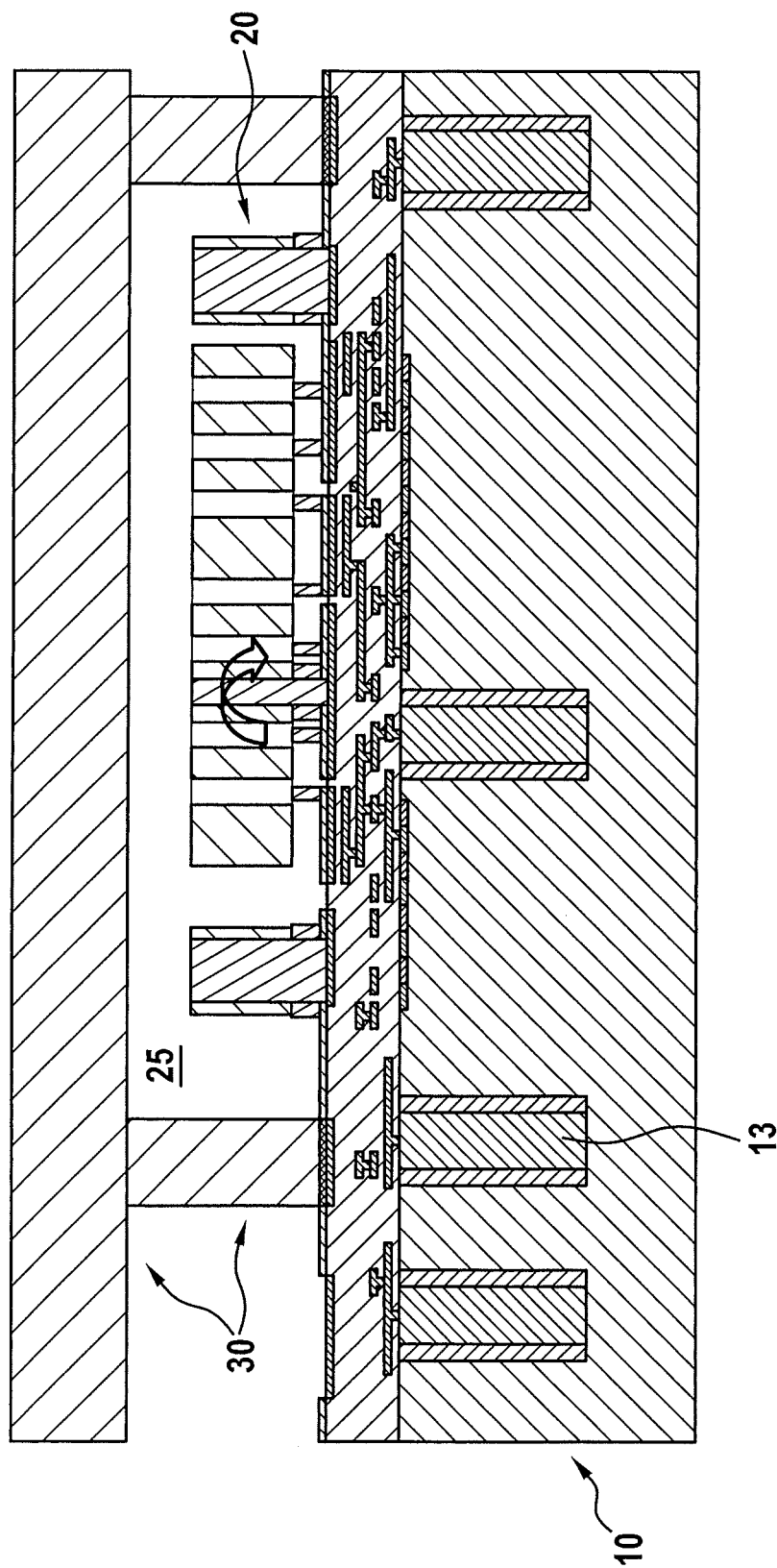

After the structuring of first MEMS substrate 20, a first pre-structured cap wafer 30 is mounted over sensor structure 21, in order to enclose sensor structure 21 in a hermetically sealed fashion under defined pressure conditions in hollow space 25 between ASIC substrate 10 and first cap wafer 30. According to FIG. 6, first cap wafer 30 is here situated over first MEMS element 20, and is connected to ASIC substrate 10 in a bonding method, for example through eutectic bonding, so that MEMS element 20 is situated completely in hollow space 25 between ASIC substrate 10 and cap wafer 30. Here it is to be noted that given a corresponding wafer design, the first cap wafer can in principle also be mounted on the MEMS substrate, so that only the sensor structure is capped.

Figure 7:
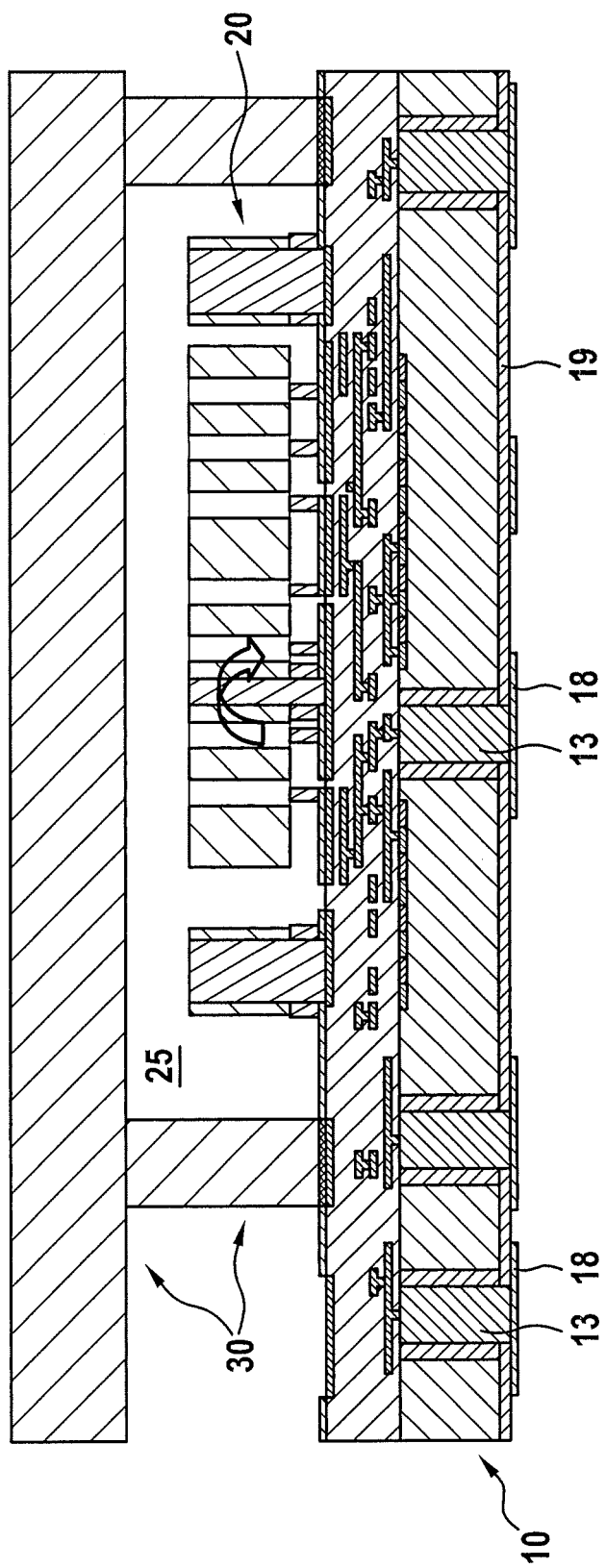

ASIC substrate 10 is now thinned on its rear side. During this, ASIC through-contacts 13 are ground. In order to produce rear-side connecting pads 18, as shown in FIG. 7, an oxide layer 19 is then first deposited on the rear side of ASIC substrate 10 and is structured. During this, oxide layer 19 is opened in the region of ASIC through-contacts 13. Over this there is deposited a metal layer, for example an Al, AlCu, or AlSiCu layer, from which rear side connecting pads 18 for through-contacts 13 are then structured out.

Figure 8:
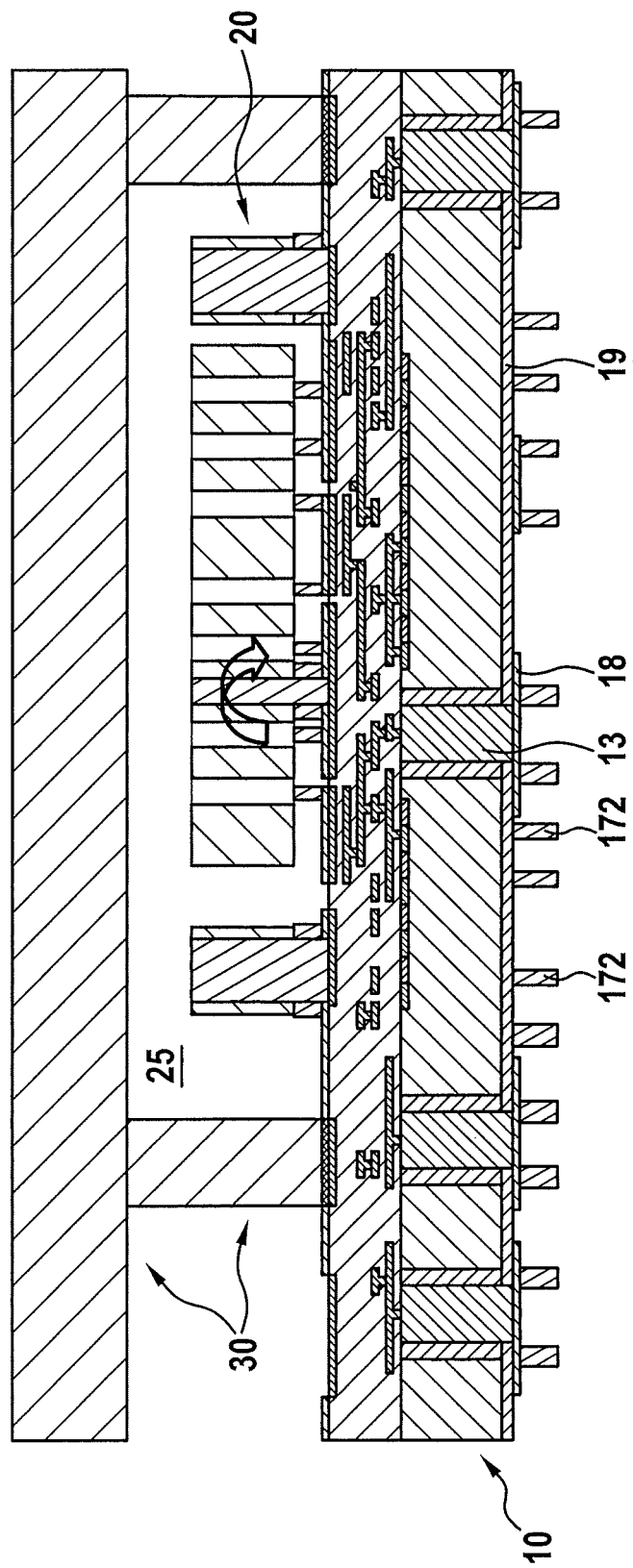

In a following method step, on the rear side of ASIC substrate 10 processed in this way a further oxide layer 172 is deposited and structured in order to create a standoff structure 172 for the mounting of a second MEMS substrate. FIG. 8 shows the result of this structuring process, and illustrates that during the structuring of oxide layer 172 accesses to rear-side connecting pads 18 of ASIC substrate 10 were also created.

Figure 9:
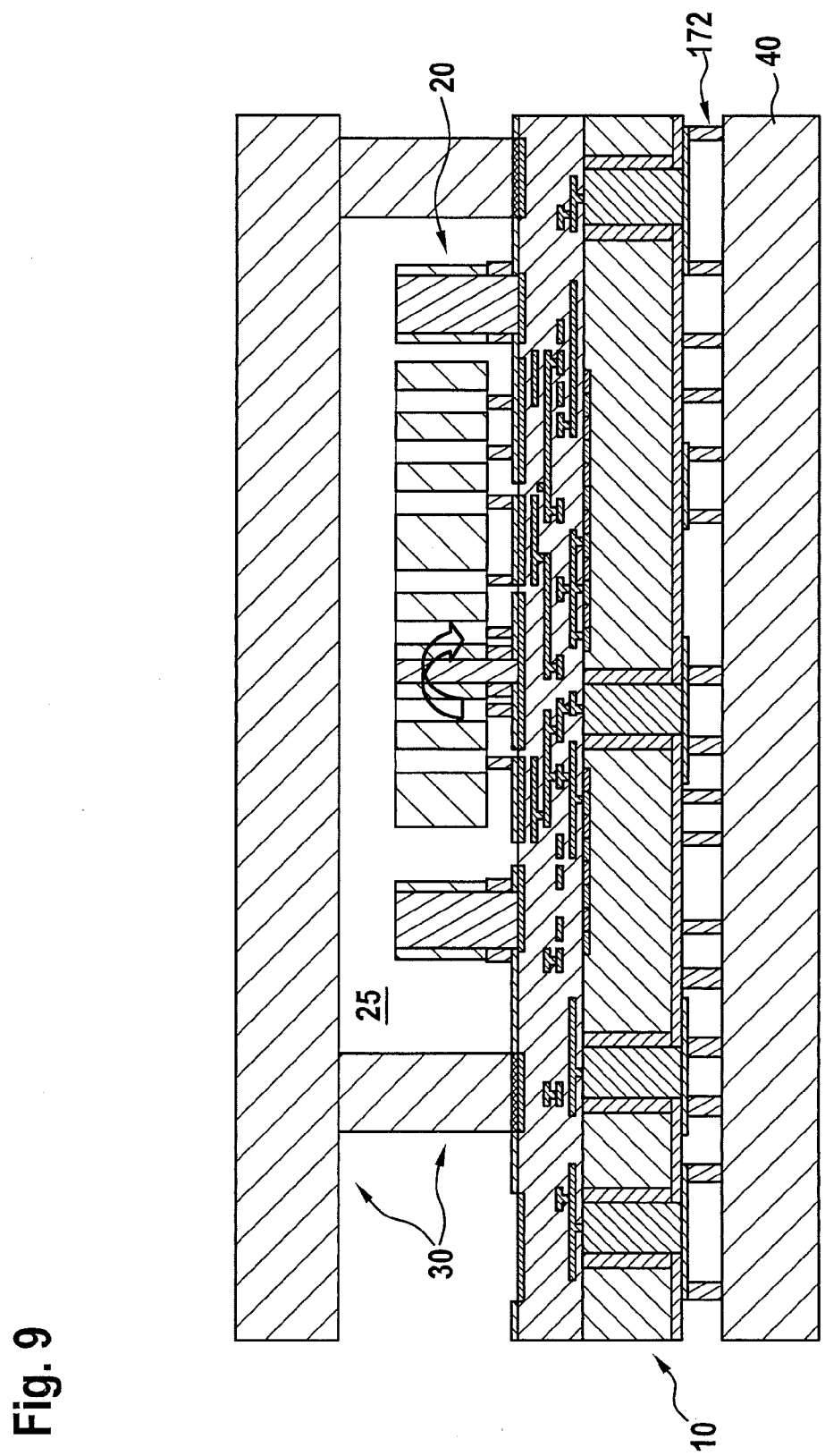

As in the case of first standoff structure 171, rear-side standoff structure 172 also forms the mounting surface for a MEMS substrate 40. The connection between this second MEMS substrate 40 and ASIC substrate 10 is here likewise produced in a plasma-activated direct bonding process, and is hermetically sealed. Second MEMS substrate 40 is then also thinned down to the sought structural height of the second MEMS element. FIG. 9 shows ASIC substrate 10 having the thinned but still unstructured second MEMS substrate 40, mounted on rear-side standoff structure 172.

Figure 10:
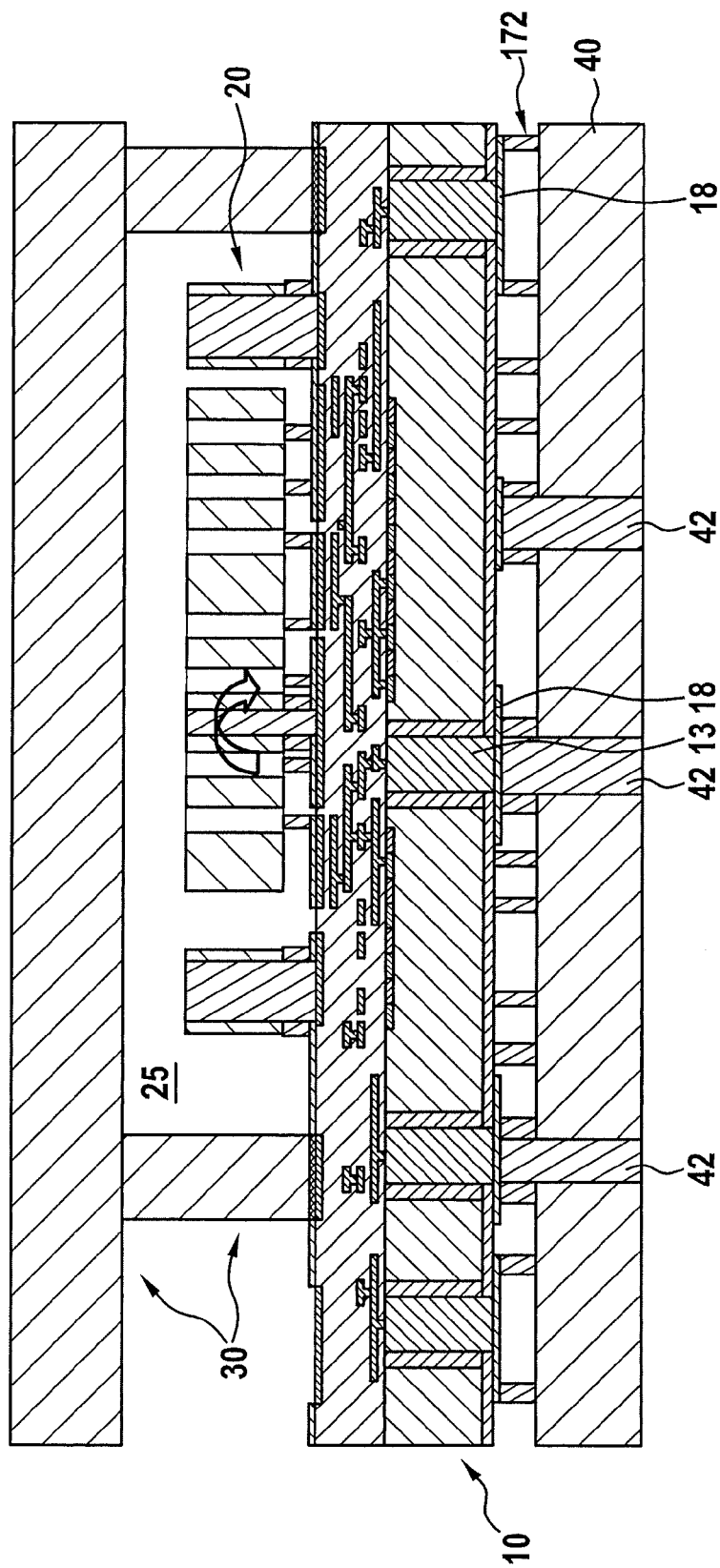

Second MEMS substrate 40 is also first structured and processed together with ASIC substrate 10. Here, again, first through-contacts 42 are produced, for which purpose second MEMS substrate 40 can be processed in exactly the same way as first MEMS substrate 20. FIG. 10 shows that a portion of through-contacts 42 in second MEMS substrate 40 is situated flush with ASIC through-contacts 13, and is connected thereto in electrically conductive fashion via corresponding connecting pads 18. In this way, second MEMS element 40 is also connected to the circuit functions of ASIC element 10. Adjacent thereto, a MEMS through-contact 42 is also shown that is connected to an insulating connecting pad 18 on the rear side of ASIC substrate 10.

Figure 11:
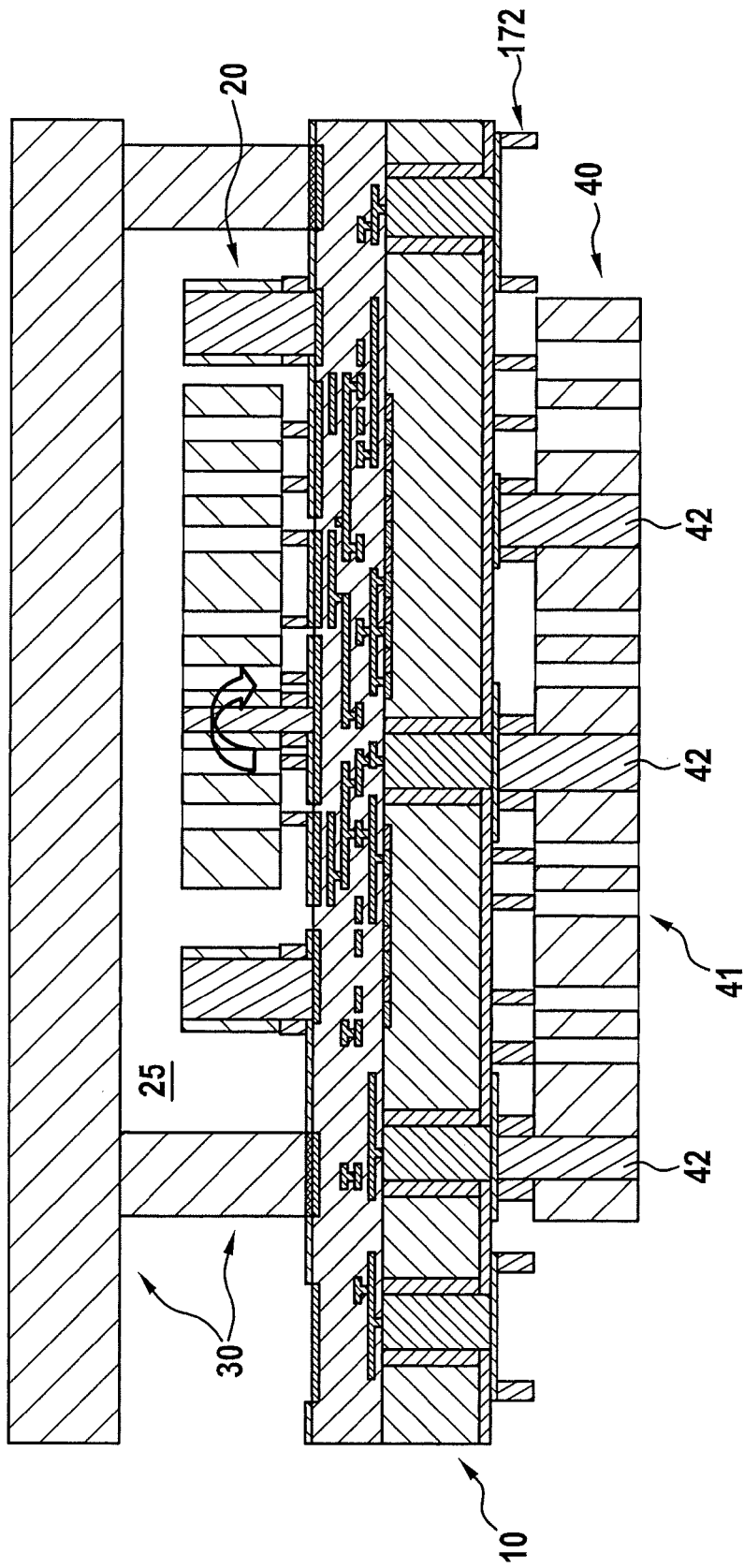

In a second structuring step, micromechanical structure 41 of second MEMS element 40 is then produced, which also extends over the entire thickness of MEMS substrate 40. Here, the layout of this micromechanical structure 41 is completely independent of the layout of micromechanical structure 21 of first MEMS element 20. FIG. 11 illustrates that in the context of the component design according to the present invention, two MEMS elements 20 and 40 can be combined in a wafer stack that differ both in their micromechanical structure and also in their function.

Figure 12:
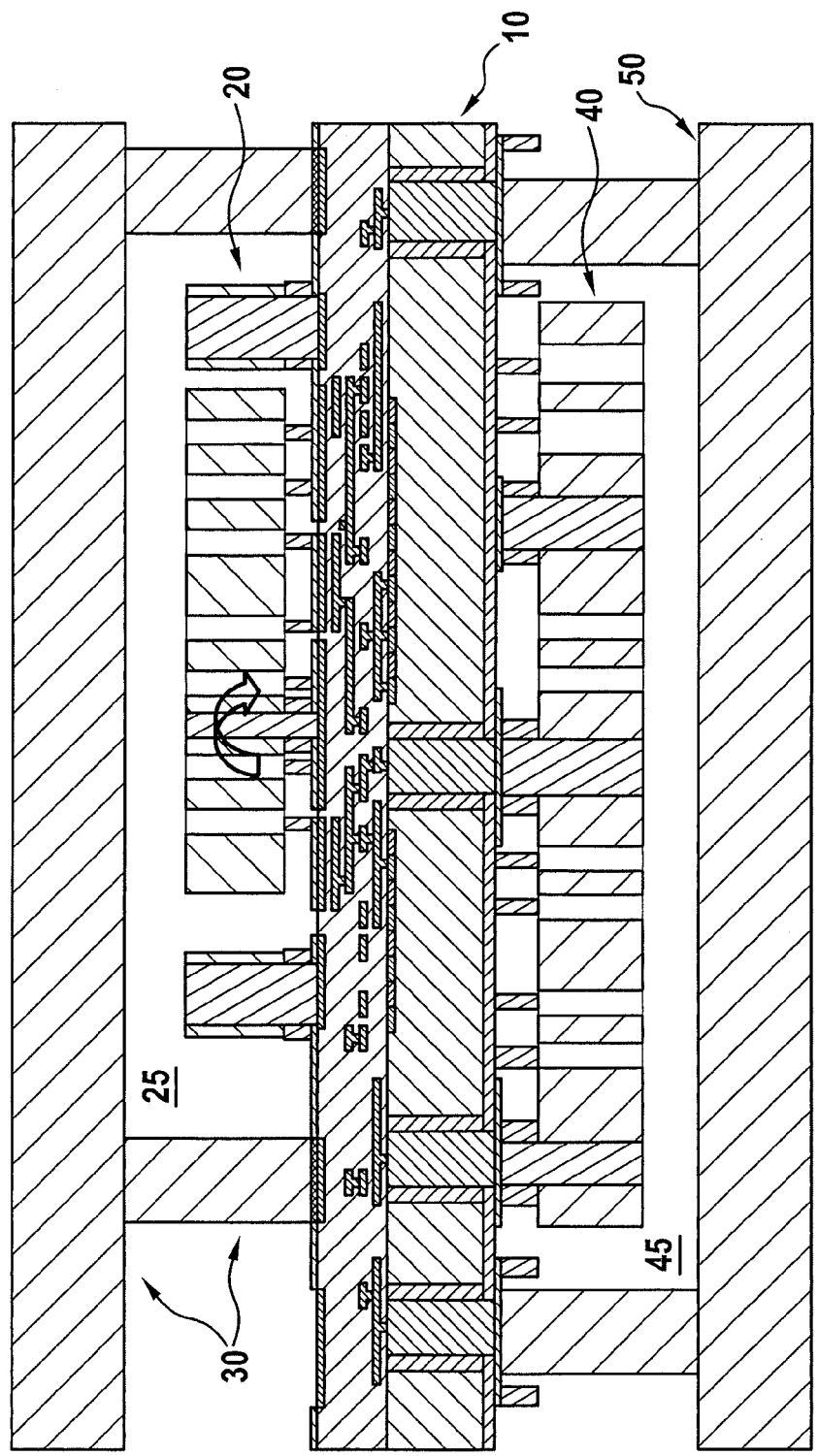

After the structuring of second MEMS substrate 40, finally a second pre-structured cap wafer 50 is mounted over second MEMS element 40 on the rear side of ASIC substrate 10, so that MEMS element 40 is completely situated in hollow space 45 between ASIC substrate 10 and cap wafer 50. This is shown in FIG. 12. Here as well, the hermetically sealed connection between cap wafer 50 and ASIC substrate 10 is produced in a bonding method, for example by eutectic bonding. Instead of the entire second MEMS element, it is also possible for only the micromechanical structure of the second MEMS element to be capped, by mounting a correspondingly configured second cap wafer on the second MEMS substrate. In order to reduce the component height, the two cap wafers 30 and 50 can then also be further thinned back before the components are detached and separated from the wafer composite.

Figure 13:
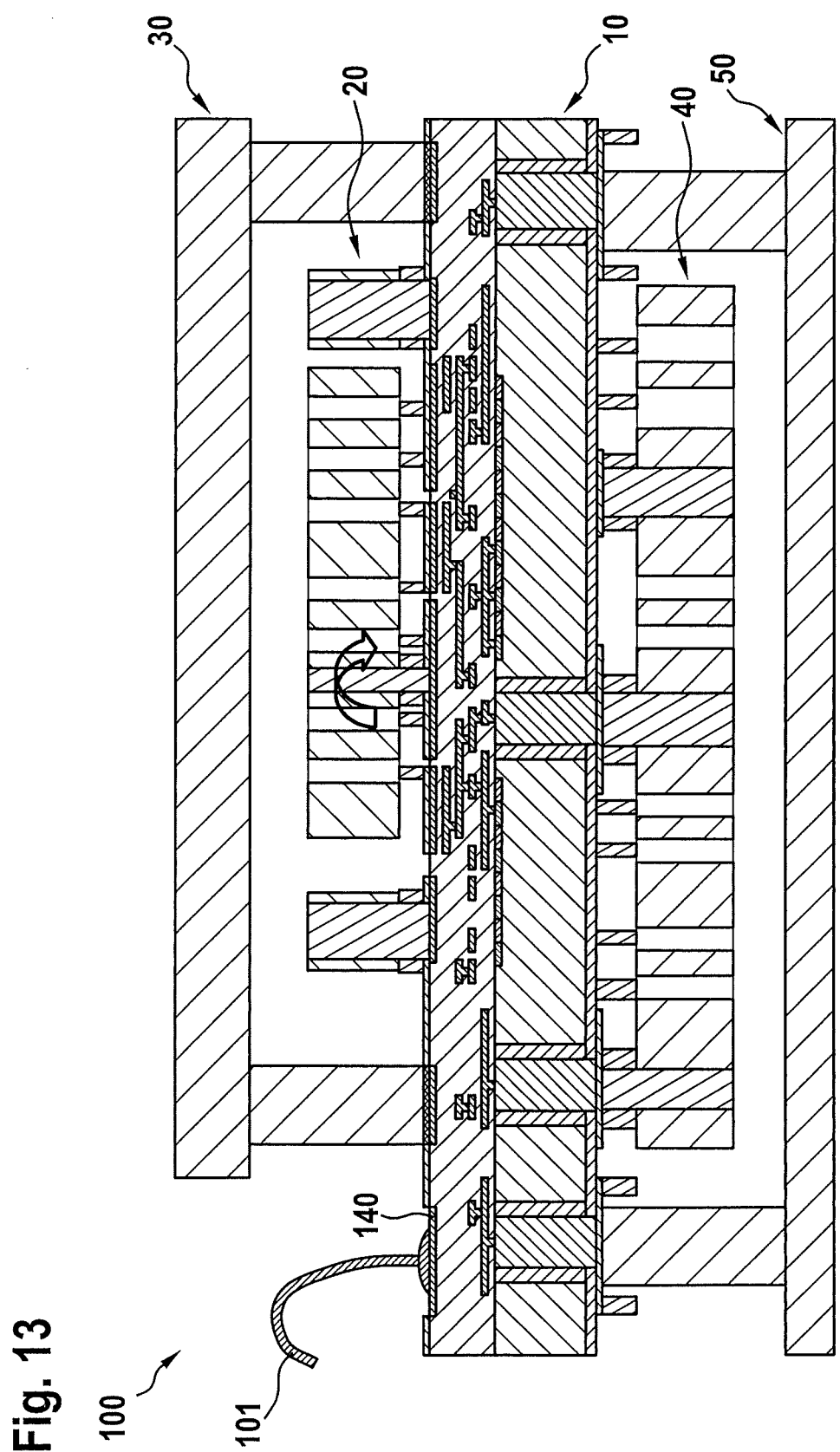

Here, first cap wafer 30 can be sawed in order to expose connecting pads 140 on the front side of ASIC substrate 10. These connecting pads 140 are used, in component 100 shown in FIG. 13, for external electrical contacting with the aid of wire bonds 101.

Figure 14:
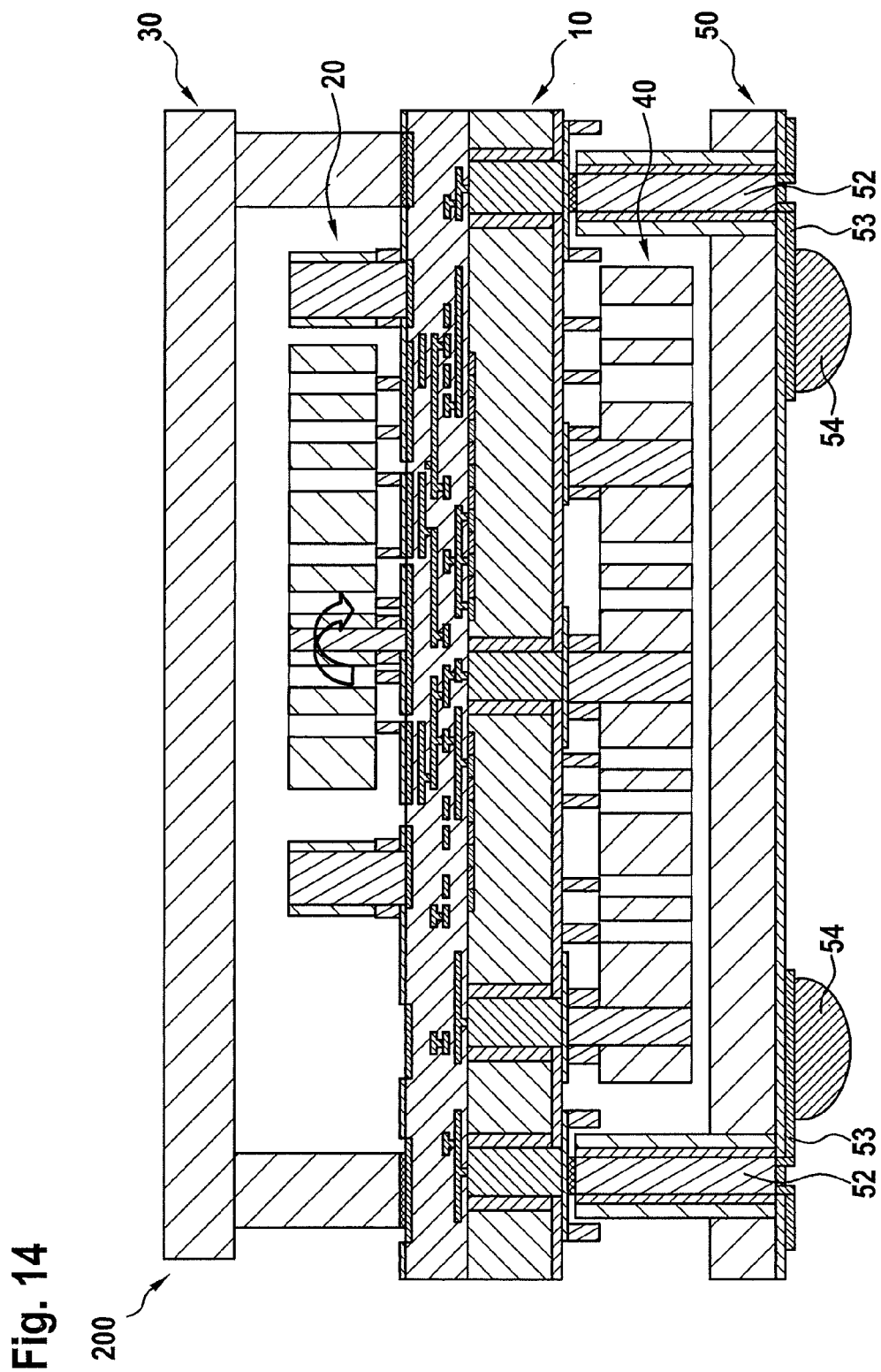
FIG. 14 shows a schematic sectional representation of a second sensor component 200 according to the present invention having cap through-contacts for external electrical contacting.

Another possibility for the external electrical contacting of a five-fold wafer stack according to the present invention is shown in FIG. 14 for the example of an element 200. The only substantial difference between component 100 and component 200 is in the cap wafer. While in the case of component 100 cap wafer 50 does not have any circuit-related function, in the context of a pre-processing cap through-contacts 52 are produced in cap wafer 50 of component 200. After the mounting of cap wafer 51 on the rear side of ASIC substrate 10, these cap through-contacts 52, together with ASIC through-contacts 13, produce an electrical connection between the circuit functions of ASIC element 10 and the lower side of the component. For the external electrical contacting of component 200, finally connecting pads 53 are produced on cap wafer 50, or on the component rear side, analogous to connecting pads 18 on the rear side of ASIC substrate 10.

Component 200 is particularly well-suited for direct mounting on circuit boards, because the electrical signals of component 200 are led outward via ASIC through-contacts 13 and cap through-contacts 52. Both the mechanical fixing of component 200 on a circuit board and the electrical contacting can here be produced easily using solder bumps 54.

In conclusion, it is again expressly to be indicated that the MEMS surfaces of a component according to the present invention can be used very flexibly. Thus, for example in the first MEMS element the sensor structure of an acceleration sensor can be realized, while the second MEMS element can be equipped with the sensor structure of a rotational rate sensor. The first MEMS element could also include the sensor structures of an acceleration sensor and a one-axis rotational rate sensor, while the sensor structure of a two-axis rotational rate sensor is fashioned in the second MEMS element.

Figure 15:
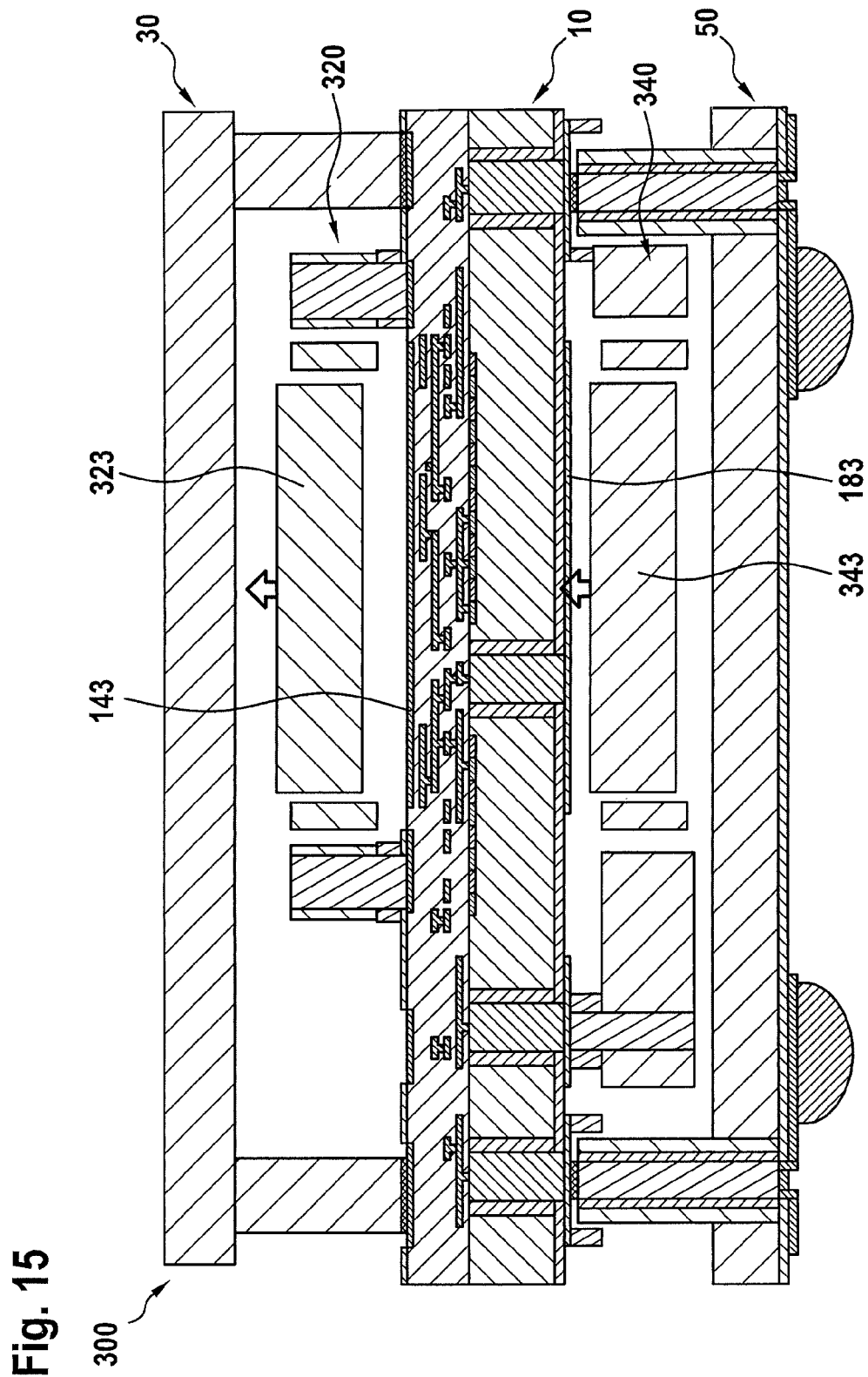
FIG. 15 shows a schematic sectional representation of a third sensor component 300 according to the present invention for acquiring z accelerations.

The two MEMS elements of a component according to the present invention can however also be equipped with a quite similar functionality, and correspondingly can also have an identical or very similar micromechanical structure, as is the case for example in component 300 shown in FIG. 15, for acquiring z accelerations. The micromechanical structure of the two MEMS elements 320 and 340 includes a seismic mass 323 or 343 that can be deflected perpendicular to the substrate level. These deflections are here each acquired capacitively using measurement electrodes on seismic masses 323 and 343 and stationary counter-electrodes 143 and 183 on the respectively oppositely situated surfaces of ASIC element 10. When there is a z acceleration, the two seismic masses 323 and 343 are deflected from the rest position in the same direction. In the case of one of the two seismic masses, the detection gap between the measurement electrode and the counter-electrode becomes larger, while this gap becomes smaller for the other seismic mass. This enables a differential evaluation of the capacitance signal, which is advantageous in particular with regard to linearity and its vibration robustness.

What is claimed is:

1. A hybridly integrated component, comprising:
an ASIC element having a processed front side;
a first MEMS element having a first substrate and a first micromechanical structure extending over an entire thickness of the first substrate, wherein at least one structural element of the first micromechanical structure is deflectable, and wherein the first MEMS element is mounted on the processed front side of the ASIC element such that a first gap exists between the first micromechanical structure and the ASIC element;
a first cap wafer mounted over the first micromechanical structure of the first MEMS element;
a second MEMS element mounted on a rear side of the ASIC element, the second MEMS element having a second substrate and a second micromechanical structure extending over an entire thickness of the second substrate, wherein the second MEMS element includes at least one deflectable structural element, and wherein a second gap exists between the second micromechanical structure and the ASIC element; and
a second cap wafer mounted over the second micromechanical structure of the second MEMS element;
wherein the ASIC element contains at least one ASIC through-contact which produces an electrical connection between the processed front side of the ASIC element and the second MEMS element on the rear side of the ASIC element.

2. The component as recited in claim 1, wherein at least one of the first cap wafer and the second cap wafer contains at least one cap through-contact for external contacting of the component.

3. The component as recited in claim 1, wherein:
at least one of the first MEMS element and the second MEMS element includes a micromechanical sensor structure having at least one seismic mass extending over an entire thickness of the at least one of the first MEMS element and the second MEMS element; and
at least a portion of a signal processing and evaluation circuit for sensor signals are integrated on the ASIC element.

4. A method for producing hybridly integrated components, comprising:
processing an ASIC substrate to provide a processed front side of the ASIC substrate;

mounting a first MEMS substrate on the processed front side of the ASIC substrate;

producing a first micromechanical structure in the mounted first MEMS substrate, the first micromechanical structure extending over an entire thickness of the first MEMS substrate;

mounting a first cap wafer over the first micromechanical structure of the first MEMS substrate;

mounting a second MEMS substrate on a rear side of the ASIC substrate;

producing a second micromechanical structure in the mounted second MEMS substrate, the second micromechanical structure extending over an entire thickness of the second MEMS substrate; and mounting a second cap wafer over the second micromechanical structure of the second MEMS substrate;

wherein in the processing of the ASIC substrate, at least one ASIC through-contact is created in the ASIC substrate, the ASIC through-contact producing an electrical connection between the processed front side of the ASIC substrate and the second MEMS substrate on the rear side of the ASIC substrate.

5. The method as recited in claim 4, wherein in the processing of the ASIC substrate, a layer construction having at least one circuit level is produced on the front side of the ASIC substrate.

6. The method as recited in claim 4, wherein the processed ASIC substrate is thinned on the rear side before the mounting of the second MEMS substrate.

7. The method as recited in claim 4, wherein at least one of: (i) a first standoff structure is produced on the front side of the processed ASIC substrate, and the first MEMS substrate is mounted on the first standoff structure; and (ii) a second standoff structure is produced on the rear side of the processed ASIC substrate, and the second MEMS substrate is mounted on the second standoff structure.

8. The method as recited in claim 4, wherein at least one of (i) an electrical connection between the first MEMS substrate and the processed ASIC substrate is produced in a first bonding method, and (ii) the electrical connection between the second MEMS substrate and the processed ASIC substrate is produced in a second bonding method.

9. The method as recited in claim 4, wherein after mounting on the processed ASIC substrate, at least one of the first MEMS substrate and the second MEMS substrate is thinned down to a specified structural height of corresponding at least one of the first micromechanical structure and the second micromechanical structure to be produced.

10. The method as recited in claim 4, wherein a structuring of at least one of the first MEMS substrate and the second MEMS substrate takes place in a trench process.

11. The method as recited in claim 4, wherein at least one of (i) in the first MEMS substrate at least one first MEMS through-contact is produced as an electrical connection between the first MEMS substrate and the ASIC substrate, and (ii) in the second MEMS substrate at least one second MEMS through-contact is produced as an electrical connection between the second MEMS substrate and the ASIC substrate.

12. The method as recited in claim 4, wherein at least one of the first cap wafer and the second cap wafer is preprocessed, prior to the mounting, to produce at least one cap through-contact for external electrical contacting.

\* \* \* \* \*